US 6,777,380 B2

(12) United States Patent
Small et al.

(10) Patent No.: US 6,777,380 B2
(45) Date of Patent: Aug. 17, 2004

(54) COMPOSITIONS FOR CLEANING ORGANIC AND PLASMA ETCHED RESIDUES FOR SEMICONDUCTOR DEVICES

(75) Inventors: Robert J. Small, Dublin, CA (US); Bakul P. Patel, Pleasanton, CA (US); Wai Mun Lee, Fremont, CA (US); Douglas Holmes, Bridge of Weir (GB); Jerome Daviot, Glasgow (GB); Chris Reid, Glasgow (GB)

(73) Assignee: EKC Technology, Inc., Hayward, CA (US)

(*) Notice: Subject to any disclaimer, the term of this patent is extended or adjusted under 35 U.S.C. 154(b) by 0 days.

(21) Appl. No.: 09/903,064

(22) Filed: Jul. 10, 2001

(65) Prior Publication Data
US 2002/0037820 A1 Mar. 28, 2002

Related U.S. Application Data
(60) Provisional application No. 60/217,650, filed on Jul. 10, 2000.

(51) Int. Cl.$^7$ ................................................ G03C 5/00
(52) U.S. Cl. ................. 510/176; 510/175; 510/245; 430/329; 134/1.3; 252/79.1
(58) Field of Search ...................... 510/176, 175, 510/245; 430/329; 134/1.3, 2, 3, 40, 38; 252/79.1, 79.3, 79.4

(56) References Cited
U.S. PATENT DOCUMENTS

| | | | |
|---|---|---|---|
| 3,592,773 A | 7/1971 | Muller | 252/79.3 |
| 4,395,479 A | 7/1983 | Ward et al. | 430/258 |
| 4,401,747 A | 8/1983 | Ward, Jr. et al. | 430/258 |
| 4,403,029 A | 9/1983 | Ward, Jr. et al. | 430/258 |
| 4,428,871 A | 1/1984 | Ward et al. | 252/542 |
| 4,508,591 A | 4/1985 | Bartlett et al. | 156/659.1 |
| 4,744,834 A | 5/1988 | Haq | 134/38 |

(List continued on next page.)

FOREIGN PATENT DOCUMENTS

| EP | 0 662 705 B1 | 8/2000 |
|---|---|---|
| WO | WO 98/36045 | 8/1998 |

OTHER PUBLICATIONS

P.J. Ireland, "High Aspect Ratio Contacts: A Review of the Current Tungsten Plug Process," Thin Solid Films 304 (1997), pp. 1–12.

C. Lee and S.C. Lee, "Effects of Plasma Treatments on the Erosion of TEOS–BPSG Films by Chemical Etchants," Solid State Electronics, vol. 41, No. 6, pp. 921–923 (1997).

M.R. Baklanov, et al., Applicability of HF Solutions Contact Hole Cleaning on Top of TiSi$_2$ Electrochemical Society Proceedings, vol. 97–35, pp. 602–609 (1998).

C. Rafols, et al., "Ionic Equilibria in Aqueous Organic Solvent Mixtures: The Equilibria of HF in an Ethanol + Water Mixture Used for Cleaning Up Semiconductors," J. Electroanalytical Chem. 433, pp. 77–83 (1997).

K. Ueno, et al., "Cleaning of CHF$_3$ Plasma–Etched SiO$_2$/SiN/Cu Via Structures with Dilute Hydrofluoric Acid Solutions," J. Electrochem. Soc., vol. 144, No. 7, pp. 2565–2572 (Jul. 1997).

(List continued on next page.)

Primary Examiner—Gregory Webb
(74) Attorney, Agent, or Firm—Morgan, Lewis & Bockius LLP

(57) ABSTRACT

A composition for the stripping of photoresist and the cleaning of residues from substrates, and for silicon oxide etch, comprising from about 0.01 percent by weight to about 10 percent by weight of one or more fluoride compounds, from about 10 percent by weight to about 95% by weight of a sulfoxide or sulfone solvent, and from about 20 percent by weight to about 50 percent by weight water. The composition may contain corrosion inhibitors, chelating agents, co-solvents, basic amine compounds, surfactants, acids and bases.

17 Claims, 7 Drawing Sheets

U.S. PATENT DOCUMENTS

| | | | |
|---|---|---|---|
| 4,770,713 A | | 9/1988 | Ward .......................... 134/38 |
| 5,129,955 A | | 7/1992 | Tanaka ......................... 134/2 |
| 5,181,985 A | | 1/1993 | Lampert et al. ............ 156/635 |
| 5,560,857 A | | 10/1996 | Sakon et al. ................ 510/175 |
| 5,563,119 A | | 10/1996 | Ward .......................... 510/176 |
| 5,571,447 A | | 11/1996 | Ward et al. ................. 510/206 |
| 5,603,849 A | | 2/1997 | Li ............................... 216/99 |
| 5,630,904 A | | 5/1997 | Aoyama et al. ............ 438/669 |
| 5,645,737 A | | 7/1997 | Robinson et al. ............. 216/99 |
| 5,672,577 A | | 9/1997 | Lee ............................ 510/175 |
| 5,705,089 A | | 1/1998 | Sugihara et al. ........... 252/79.1 |
| 5,709,756 A | | 1/1998 | Ward et al. ................. 134/1.3 |
| 5,792,274 A | | 8/1998 | Tanabe et al. .............. 134/1.3 |
| 5,885,477 A | | 3/1999 | Rasmussen et al. ....... 252/79.2 |
| 5,905,063 A | * | 5/1999 | Tanabe et al. .............. 510/176 |
| 5,928,430 A | | 7/1999 | Ward et al. |
| 5,962,385 A | * | 10/1999 | Maruyama et al. ......... 510/176 |
| 5,972,862 A | * | 10/1999 | Torii et al. .................. 510/175 |
| 5,981,454 A | | 11/1999 | Small ......................... 510/175 |
| 6,048,406 A | | 4/2000 | Misra et al. .................... 134/2 |
| 6,235,693 B1 | * | 5/2001 | Cheng et al. ............... 510/175 |
| 6,248,704 B1 | * | 6/2001 | Small et al. ................ 510/176 |

OTHER PUBLICATIONS

T. Kujime, et al., "The Cleaning of Particles From Si Water Surface by Fluorine Solution Excited by Megasonic," Proceedings of the 1996 Semi. Pure Water and Chemicals, pp. 245–256 (1996).

P. Singer, "Wafer Cleaning: Making the Transition to Surface Engineering," Semiconductor Int'l, p. 88–92 (Oct. 1995).

M. Liehr and S.R. Kasi, "HF and UV–Ozone Integrated Wafer Preclean: Chemistry and Effects on Thermal Gate Oxide," 1991 Int'l Conf. on Solid State Devices and Materials, Yokohama, pp. 484–486 (1991).

L.O. Ohman and S. Sjöberg, "Equilibrium and Structural Studies of Silicon(IV) and Aluminum(III) in Aqueaous Solution. Part 9. A Potentiometric Study of Mono– and Poly–nuclear Aluminum(III) Citrates," J. Chem. Soc. Dalton Trans., pp. 2513–2517 (1983).

* cited by examiner

FIG. 5A
FIG. 5B
FIG. 5C
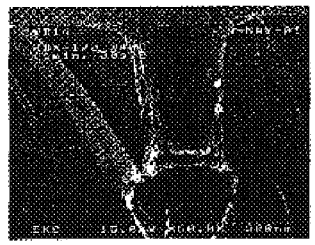
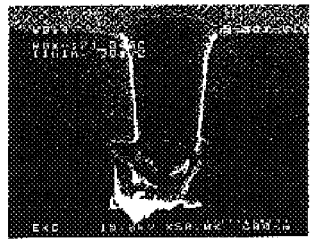
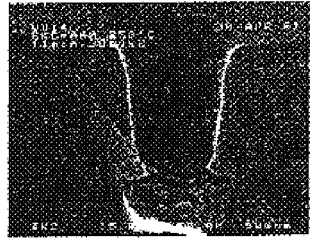

COMPOSITIONS FOR CLEANING ORGANIC AND PLASMA ETCHED RESIDUES FOR SEMICONDUCTOR DEVICES

This application claims priority to Provisional Patent Application No. 60/217,650 filed Jul. 10, 2000 entitled, "Compositions for Cleaning Organic and Plasma Etched Residues for Semiconductor Devices".

BACKGROUND OF THE INVENTION

1. Field of the Invention

This invention relates to semi-aqueous stripping and cleaning compositions that are particularly useful for stripping photoresists and cleaning organic and inorganic compounds, including post etch and post ash residues, from a semiconductor substrate. The invention is also useful as a silicon oxide etchant. As used herein, the term "semi aqueous" refers to a mixture of water and organic solvent. The invention also includes methods of using this composition to strip photoresists, clean organic and inorganic compounds from semiconductor substrates, and etch silicon oxide. More particularly, the invention describes semi aqueous stripping, cleaning and etching compositions and processes for the use thereof. The solutions contain fluoride compounds, sulfoxide or sulfone solvents, water and may contain other solvents, corrosion inhibitors, chelating agents, basic amine compounds, surfactants, acids and bases.

2. Description of Related Art

Fluoride containing chemistries have been used for many years with prime silicon wafers (wafers that have not yet undergone ion implantation or device construction) in the semiconductor industry. Normally the fluoride chemistry (usually dilute hydrofluoric acid) is used as the last process step in the sequence called "RCA rinses". The substrate is often contaminated from previous process steps with monolayer amounts of metal, anions and/or organic contaminants or surface residues (particles). These contaminants have been shown to have a significant impact on the electrical integrity of simple test device structures and these structures need to be cleaned efficiently without impairing their integrity. Such cleaning methods could include techniques discussed in the technical literature, for example, mt. Conf. On Solid State Devices and Materials, 1991, pp. 484–486 or Kujime, T. et al., Proc. of the 1996 Semi. Pure Water and Chemicals, pp. 245–256 and Singer, P. *Semi. International*, p. 88, October 1995.

Patents that teach methods for cleaning prime wafers with low pH solutions include U.S. Pat. Nos. 5,560,857 and 5,645,737; 5,181,985; 5,603,849; 5,705,089.

Using fluoride chemistries (usually HF) as a final RCA cleaning step will cause the silicon wafer surface to be in a hydrophobic state (the surface is covered with Si—H groups) which will repel water. During this step a certain proportion of the wafer surface is dissolved (removed). Unless the conditions are carefully monitored (time, temperature, solution composition) the substrates can be damaged, as reported by Rafols, C. et al., J. Electroanalytic Chem. 433. pp. 77–83, 1997. Numerous compositions combine water and organic solvents. The water concentration in these solutions is very critical. Silica oxide has an etch rate of 21 Å/min (@25° C.) in HF/water, but in isobutanol the rate was reduced to 2.14 Å/min and even lower in acetone (an aprotic solvent) the rate was only 0.12 Å/min, as reported at NSF/SRC Eng. Res. Center, Environmentally Benign Semiconductor Manufacturing, Aug. 5–7, 1998, Stanford University.

After the Front End of Line (FEOL) cleaning process the wafer proceeds to the typical Back End of Line (BEOL) manufacturing process for a semiconductor devices, in which the devices might be dynamic random access memories (DRAMs), static random access memories (SRAMs), logic, electrically programmable read only memories (EPROMs), complementary metal on silicon (CMOS), and the like. Etching fabrication technology using chemical reactions (liquid or plasma) has been used as a method of forming a wiring structure on such semiconductor substrates.

A photoresist film is deposited on the wafer to form a mask, then a substrate design is imaged on the film layer, baked, and the undeveloped image is removed with a developer. The remaining image is then transferred to the underlying material through etching (either a dielectric or metal) with reactive etching gases promoted with plasma energy.

The etchant gases selectively attack the unprotected area of the substrate. Liquid or wet etching chemistries have been used extensively over the years to etch metals, oxides and dielectrics. These chemistries can be very aggressive and can result in isotropic etching (etching equally in all directions).

Increasingly, plasma etching, reactive ion etching or ion milling are used, and such etching processes produce undesirable by-products from the interaction of the plasma gases, reacted species and the photoresist. The composition of such by-products is generally made up of the etched substrates, underlying substrate, photoresist and etching gases. The formation of such by-products is influenced by the type of etching equipment, process conditions and substrates utilized. These by-products are generally referred to as "sidewall polymer," "veil" or "fences" and cannot be removed completely by either oxygen plasma or conventional solvents. Examples of alkaline/solvent mixture types of photoresist strippers which are known for use in stripping applications include dimethylacetamide or dimethylformamide and alkanolamines as described in U.S. Pat. Nos. 4,770,713 and 4,403,029; 2-pyrrolidone, dialkylsulfone and alkanolamines as described in U.S. Pat. Nos. 4,428,871, 4,401,747, and 4,395,479; and 2-pyrrolidone and tetramethylammonium hydroxide as described in U.S. Pat. No. 4,744,834. Such stripping compositions, however, have only proven successful in cleaning "sidewall polymer" from the contact openings and metal line etching in simple microcircuit manufacturing involving a single layer of metal process when the metal structure involves mainly Al—Si or Al—Si—Cu and the "sidewall polymer" residue contains only an organometallic compound with aluminum.

If etching residue is not removed from the substrate, the residue can interfere with subsequent processes involving the substrate. The need to effectively remove etching residue and photoresist from a substrate becomes more critical as the industry progresses into submicron processing techniques. The requirement for cleaning solutions that remove all types of residue generated as a result of plasma etching of various types of metals, such as aluminum, aluminum/silicon/copper, titanium, titanium nitride, titanium/tungsten, tungsten, silicon oxide, polysilicon crystal, etc., while not corroding the underlying metal presents a need for more effective chemistry in the processing area. The effect of poor cleaning results in low device yield, low device reliability, and low device performance.

Also, if the components in these residues are not removed or neutralized in some manner then the residues will absorb moisture and form acidic species that can corrode the metal structures. The resultant acid corrodes wiring materials to bring about an adverse effect such as an increase in electrical resistance and wire disconnection. Such problems frequently occur, in particular in aluminum and aluminum alloys generally used as wiring material. The wafer substrate in contact with acidic materials, if not controlled, can destroy the metal structures. Following completion of the etching operation it is necessary that the post-etch resist mask be removed from the protective surface to permit finishing operations.

It is desirable to develop an improved cleaning composition to remove the organic polymeric substance from a coated inorganic substrate without corroding, dissolving or dulling the metal circuitry or chemically altering the wafer substrate.

Sidewall residues have been removed with either acidic organic solvents or alkaline organic solvents. The acidic solvents are generally composed of phenolic compounds or chloro-solvent and/or an aromatic hydrocarbon and/or alkylbenzenesulfonic acids. These formulations generally need to be used at temperatures up to and beyond 100° C. These chemistries normally need to be rinsed with isopropanol.

In addition, stripping compositions used for removing photoresist coatings and cleaning composition for removing post-etch residue have for the most part been highly flammable, generally hazardous to both humans and the environment, and comprise reactive solvent mixtures exhibiting an undesirable degree of toxicity. Moreover, these compositions are not only toxic, but their disposal is costly since they might have to be disposed of as a hazardous waste. In addition, these compositions generally have severely limited bath life and, for the most part, are not recyclable or reusable.

The photoresist around the contact hole of common interlayer dielectrics, TEOS (tetraethylorthosilicate) and boron phosphosilicate glass (BPSG), which are commonly used in ultra large scale integration (ULSI) structures for better conformity of step coverage, is usually removed with HF solutions. It is not uncommon for the HF to also attack the dielectric material. Such attack is not desirable (see Lee, C. and Lee, 5, *Solid State Electronics*, 4, pp. 921–923 (1997)). Accordingly, a need exists for a more environmentally friendly stripping and cleaning formulation.

Dilute hydrofluoric acid solutions can under certain conditions remove the sidewall polymers by aggressively attacking the via sidewall of the dielectric and therefore changing the dimensions of the device, as taught by Ireland, P., *Thin Solid Films*, 304, pp. 1–12 (1997), and possibly the dielectric constant. Previous chemistries that contain HF, nitric acid, water and hydroxylamine are aggressive enough to etch silicon, as taught by U.S. Pat. No. 3,592,773 issued to A. Muller. Recent information also indicates that the dilute HF solutions can be ineffective for cleaning the newer $CF_x$ etch residues, as taught by K. Ueno et al., "Cleaning of $CHF_3$ Plasma-Etched $SiO_2$/SiN/Cu Via Structures with Dilute Hydrofluoric Acid Solutions," *J. Electrochem. Soc.*, vol. 144, (7) 1997. Contact holes opened on to the $TiSi_2$ have also been difficult to clean with HF solutions since there appears to be an attack of the underlying $TiSi_2$ layer. There may also be difficulty with mass transport of the chemicals in the narrow hydrophilic contact holes, as taught by Baklanov, M. R. et al., Proc. Electrochem. Soc., 1998, 97–35, pp. 602–609.

Recently, fluoride-based chemistries have been used in limited cases to remove post etch residues. Many of these compositions contain fluoride components, specifically hydrogen fluoride. In addition these compositions might contain strong caustic chemicals (choline-derivatives, tetraalkyl ammonium hydroxide, ammonium hydroxide) such as disclosed in U.S. Pat. No. 5,129,955; U.S. Pat. No. 5,563,119; or U.S. Pat. No. 5,571,447, or might use a two-phase solvent system, which contains one phase with hydrofluoric acid and water while a second phase contains a nonpolar organic solvent (ketones, ethers, alkanes or alkenes) (U.S. Pat. No. 5,603,849). Other formulations include hydroxylamine and ammonium fluoride (U.S. Pat. No. 5,709,756, issued to Ward). Additional examples include quaternary ammonium salt and fluoride based compositions, as disclosed in published European Application 0662705, and organocarboxylic ammonium salt or amine carboxylate and fluoride based compositions, as disclosed in U.S. Pat. No. 5,630,904.

Other methods for cleaning metal and metal oxide residues on wafers include spraying water vapor into the plasma ashing chamber followed by introducing fluorine containing gases (hydrofluoric acid) (U.S. Pat. No. 5,181,985) or a liquid containing hydrofluoric acid. ammonium fluoride and water with a pH between 1.5 to less than 7.

Some chemistries have also included chelating agents to help remove ionic and anionic contamination from the wafer surface (PCT US98/02794) but chelating agents such as citric acid, gallic acid, and catechol among others, can be aggressive toward the aluminum oxide that covers the Al metal lines. Studies by Ohman and Sjoberg show that the strong complexing ability of citric ions can increase the aluminum oxide solubility and thereby expose the metal to further corrosion, by factors of 166 and 468 at pH 5 and 6 (see Ohman et al., *J. Chem. Soc., Dalton Trans.* (1983), p. 2513).

Other resist-remover chemistries, such as those in U.S. Pat. No. 5,792,274, have included a salt of hydrogen fluoride combined with a water-soluble organic solvent and water at a pH of 5 to 8. However, no mention is made of the use of ammonium hydrogen fluoride (or ammonium bifluoride), which provides greater stability than ammonium fluoride, or the use of a synergistic mixture of co-solvents or basic amine compounds with DMSO and a fluorinated compound.

U.S. Pat. No. 6,048,406 issued Apr. 11, 2000 to Misra et al. entitled "Benign Method for Etching Silicon Dioxide" teaches using an aqueous solution of ammonium hydrogen biflouride (($NH_4$)$HF_2$) as an alternative to hydrofluoric acid because it is more benign for wet etching silicon oxide. However, there is no teaching of the use of a formulation that can remove photoresist or an etching residue. Also, there is no teaching of adding a synergistic mixture of co-solvents or basic amine compounds.

U.S. Pat. No. 5,885,477 issued Mar. 23, 1999 to Rasmussen et al. entitled "Silicon Dioxide Etch Process Which Protects Metal" teaches using an aqueous solution of ammonium fluoride and hydrofluoric acid with a salt to etch silicon oxide while minimizing corrosion. However, there is no teaching of the use of ammonium hydrogen bifluoride, co-solvents or basic amine compounds.

U.S. Pat. No. 4,508,591 issued Apr. 2, 1985 to Bartlett et al. entitled "Polymethyl Methacrylate Compatible Silicon Dioxide Complexing Agent" teaches using ammonium fluoride and citric acid to etch silicon dioxide. However, as with Rasmussen et al., there is no teaching of the use of ammonium hydrogen bifluoride, co-solvents or basic amine compounds. Nor is there any teaching to use such a formulation for removing etch residue or photoresist.

Accordingly, there exists a need to develop improved silicon dioxide etchant and photoresist and post-etch residue remover for a variety of unwanted materials from a wide variety of substrates. Particularly in the field of integrated circuit fabrication, it should be recognized that the demands for improved removal performance with avoidance of attack on the substrates are constantly increasing. This means that compositions that were suitable for less sophisticated integrated circuit substrates may not be able to produce satisfactory results with substrates containing more advanced integrated circuits in the process of fabrication. These compositions should also be economical, environmental friendly and easy to use.

The present invention teaches such a new and improved stripping and cleaning composition and a process for its use. The present invention also includes silicon oxide etching compositions and their use. This composition is aqueous, dissolves both organic and inorganic substances, and, when used in the process, is able to strip and clean a variety of substrates.

SUMMARY OF THE INVENTION

The novel stripping, cleaning and etching compositions of the invention exhibit synergistically enhanced capabilities that are not possible from the use of the individual components, or the components in combination with other components.

It is one objective of the invention to provide etch residue removing compositions that: effectively clean post-etch residues from substrates, inhibit redeposition of metal ions, and are corrosion resistant.

It is a further objective of the invention to provide effective photoresist stripping compositions.

Another objective is to provide effective silicon oxide etching compositions.

These and related objectives are attained through the use of the composition and process disclosed herein.

A composition in accordance with this invention is for photoresist stripping and comprises from about 0.01 percent by weight to about 10 percent by weight of one or more fluoride compounds, an effective amount of up to about 95 percent by weight of one or more solvents that are sulfoxides or sulfones, and at least about 20 percent by weight water. Additionally, the composition may optionally contain basic amines, co-solvents, corrosion inhibitors, chelating agents, surfactants, acids and bases. A preferred embodiment contains ammonium hydrogen fluoride, DMSO, and water.

A composition in accordance with this invention is for post-etch residue cleaning and comprises from about 0.01 percent by weight to about 10 percent by weight of one or ore fluoride compounds, an effective amount of from about 10 to about 95 percent by eight of one or more certain solvents, and at least about 20 percent by weight water. A referred embodiment consists of ammonium hydrogen fluoride, DMSO, and water.

Additionally, the composition may optionally contain basic amines, co-solvents, corrosion inhibitors, chelating agents, surfactants, acids and bases.

Another preferred composition for cleaning and stripping consists of ammonium hydrogen fluoride, DMSO, water, and a co-solvent selected from the group consisting of acetic acid, methyl acetate, methyl lactate, ethyl acetate, ethylene glycol diacetate, ethyl lactate, propylene glycol, propylene carbonate, N-methyl pyrrolidone, methoxyethoxyethanol and polyethylene glycol monolaurate.

Another preferred composition for cleaning and stripping consists of ammonium hydrogen fluoride, DMSO, water, and a basic amine selected from the group consisting of hydroxylamine, hydrazine, 2-amino-2-ethoxy ethanol, monoethanolamine, diethylhydroxylamine, choline, tetramethylammonium formate, monoisopropanolamine, diethanolamine, and triethanolamine.

If said composition in accordance with this invention is used for metal and oxide etching, the content of the fluoride compound is elevated. For example, for use as a silicon etchant, it is preferred to have about 20% of a 40% aqueous ammonium fluoride solution.

A process for photoresist stripping in accordance with this invention comprises contacting the substrate with a composition comprising one or more fluoride compounds, water and sulfoxide solvent at a temperature and for a time sufficient to strip the photoresist.

A process for cleaning residue from a substrate in accordance with this invention comprises contacting the substrate with a composition comprising one or more fluoride compounds, water and sulfoxide solvent at a temperature and for a time sufficient to clean the substrate.

A process for metal or oxide etch in accordance with this invention comprises contacting the metal or oxide with a composition comprising one or more fluoride compounds, water and sulfoxide or sulfone solvent at a temperature and for a time sufficient to etch the metal or oxide.

BRIEF DESCRIPTION OF THE DRAWINGS

FIGS. 5A, 5B and 5C show the cleaning results when using different additional compounds, propylene glycol, acetyl acetone and 2-amino-2-ethoxy ethanol, respectively.

DETAILED DESCRIPTION OF THE INVENTION

Figure 1:
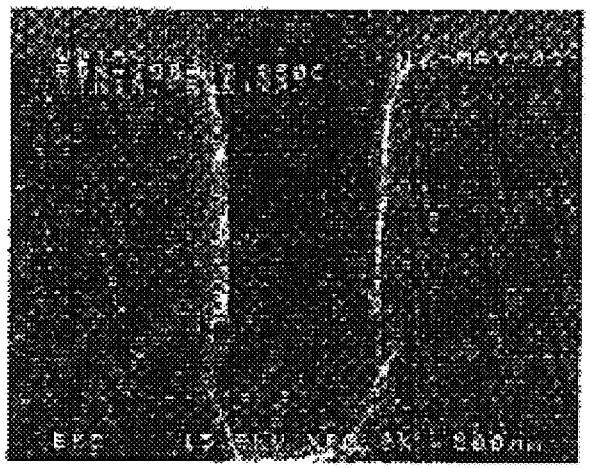
FIG. 1 is an SEM of a via effectively cleaned using a formulation containing a co-solvent.
Figure 2:
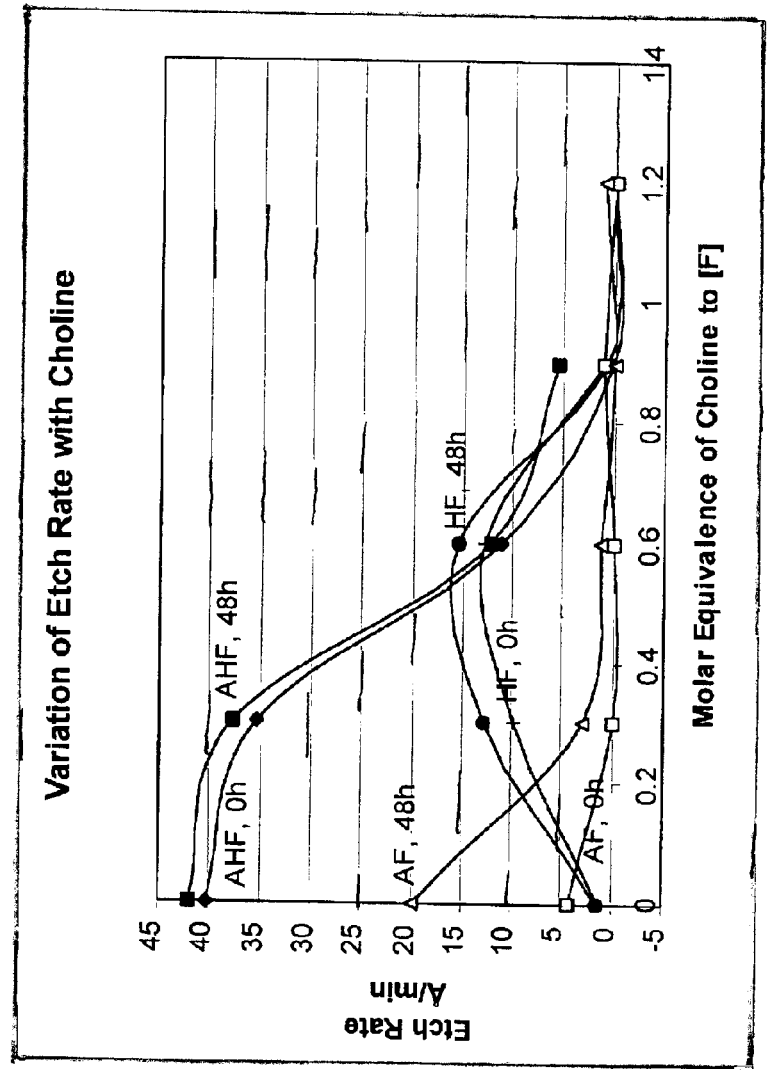
FIG. 2 shows the effect of choline on the etch rate of fluoride containing compounds.
Figure 3:
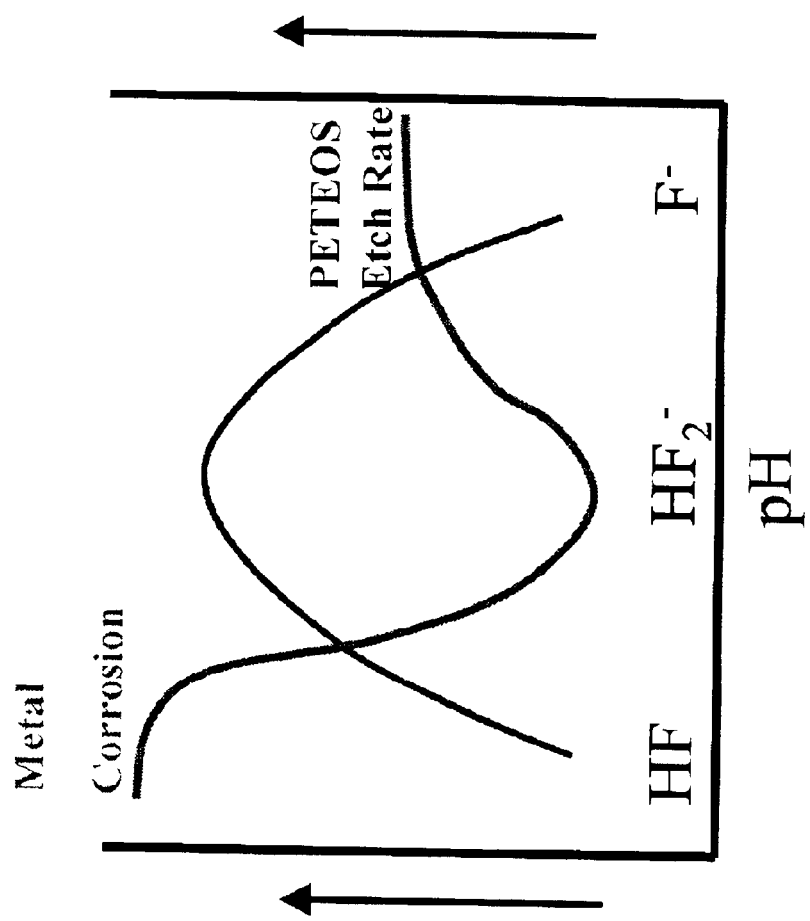
FIG. 3 shows the inverse relationship of corrosion rate v. the etch rate of $HF_2^-$.

The manufacture of electronic devices typically involves the use of photoresist removers, etch residue removers and silicon oxide etchants at particular times in the manufacturing process. Fluoride containing formulations have been used to some extent for these purposes. However, some formulations with fluoride containing compounds such as ammonium fluoride have given inconsistent silicon oxide etch rates due to the evaporation of ammonia from the liquid phase. When the ammonia evolves from the solution, the concentration of the active species of $HF_2^-$ and HF increases and more aggressively attacks the silicon dioxide. In addition, it has been found that the use of aqueous formulations of fluoride compounds, such as ammonium fluoride and hydrofluoric acid, and solvents, such as dimethylsulfoxide, fail to provide adequate resist and residue removal without significant corrosion of the underlying metal unless additional compounds are added to the formulation.

The present invention discloses novel formulations which provide consistent silicon oxide etch rates and effectively remove photoresist and etch residues while inhibiting the corrosion of the underlying metal. In one embodiment, the present invention applies the use of aqueous fluoride formulations that use ammonium hydrogen fluoride, which is a more stable fluoride compound and does not result in the same problems experienced by ammonium fluoride and hydrogen fluoride regarding either inconsistent silicon oxide rates or excessive corrosion.

In another embodiment, the invention applies the use of aqueous fluoride formulations with sulfoxide and sulfone solvents and co-solvents including esters such as methyl acetate, ethyl acetate, butyl acetate, methyl lactate, and ethyl lactate, glycols such as propylene glycol, lactams such as N-methyl pyrrolidone and the like, which aid in the cleaning effectiveness of the fluoride formulation.

In another embodiment, the invention applies the use of aqueous fluoride formulations with sulfoxide and sulfone solvents and basic amine compounds such as 2-amino-2-ethoxy ethanol, monoethanolamine, monoisopropanolamine and the like which assist in cleaning effectiveness and inhibit corrosion.

These embodiments can be used separately or combined.

The first component of the compositions of the present invention is a fluoride containing compound which may be used alone or in combination with at least one other fluoride containing compound. The fluoride containing compound or mixture of compounds is suitably selected according to the situation and is in the range of about 0.01 percent by weight to about 10 percent by weight.

Suitable fluoride compounds are ammonium fluoride, ammonium hydrogen fluoride and hydrogen fluoride. The preferred fluoride compounds are ammonium fluoride and ammonium hydrogen fluoride. The most preferred fluoride compound is ammonium hydrogen fluoride. For removing residues and photoresists, the fluoride compounds are desirably present in an amount of from about 0.01 percent by weight to about 10 weight percent. In general, the lower the concentration of the fluoride compound in the composition, the higher the temperature of use needs to be.

The silicon oxide etch compositions of the present invention also contain one or more fluoride compounds but the compounds are preferably present in an amount from about 7 weight percent to about 10 weight percent.

The second component include sulfoxide solvents and sulfone solvents or mixtures thereof which correspond to the following:

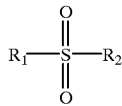

where $R_1$ and $R_2$ are an H, OH or alkyl group, at least one is an alkyl group.

Suitable sulfoxide solvents include the following and mixtures thereof: dimethyl sulfoxide (DMSO), dipropylsulfoxide, diethylsulfoxide, methylethylsulfoxide, diphenylsulfoxide, methylphenylsulfoxide, 1,1'-dihydroxyphenyl sulfoxide and the like.

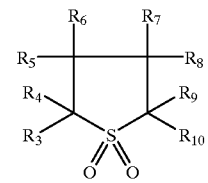

where $R_3$–$R_{10}$ are independently H or an alkyl group.

Suitable sulfone solvents include the following and mixtures thereof dimethylsulfone, diethylsulfone, and the like. The sulfoxide or sulfone solvents or mixtures thereof are suitably selected according to the situation and are present in the range of about 10 percent by weight to about 95 percent by weight.

A preferred embodiment has a solvent to water ratio of about 60:40 although higher or lower ratios may be suitable depending on the particular application. At a ratio of about 60:40 solvent to water no over etching was observed and all residues were removed. Significantly higher solvent to water ratios may lead to over etch of the via sidewall.

As stated earlier, aqueous formulations using a fluoride containing compound that is not ammonium hydrogen fluoride with a sulfoxide solvent will not provide adequate cleaning without resulting in significant corrosion. Thus, where ammonium hydrogen fluoride is not used, one or more co-solvents or basic amine compounds are added to optimize the effectiveness of the formulation while minimizing corrosion. Suitable co-solvents include the following and mixtures thereof: N-alkyl lactams, such as N-methyl-2-pyrrolidone, ester compounds such as acetic acid, methyl acetate, methyl lactate, ethyl acetate, ethyl lactate, glycols such as propylene glycol, ethylene glycol diacetate, polyethylene glycol monolaurate and other suitable co-solvents such as propylene carbonate, methoxyethoxyethanol and the like.

Suitable basic amine compounds include the following and mixtures thereof: hydroxylamine, hydrazine, 2-amino-2-ethoxy ethanol (DGA), monoethanolamine (MEA), diethylhydroxylamine, cholines, tetramethylammonium formate (TMAF), monoisopropanolamine (MIPA), diethanolamine (DEA), triethanolamine (TEA) and the like.

It has been found that the use of ammonium hydrogen fluoride, or ammonium bifluoride, provides for improved stability over other fluoride compounds and provides a significantly higher etch rate because it generates $HF_2$ directly. Interestingly, $HF_2$ is also the species least corrosive to metals. Thus, it has been found that the use of ammonium hydrogen fluoride will minimize the corrosion of metals as compared to other fluoride compounds.

In addition to the components listed above, the composition contains water. Typically high-purity deionized water is used.

The composition may optionally contain other solvents that would be known to one skilled in the art, including amides and polyols.

The composition may optionally contain corrosion inhibitors. Suitable corrosion inhibitors include inorganic nitrate salts such as ammonium, potassium, sodium and rubidium nitrate salts, aluminum nitrate and zinc nitrate.

The composition may optionally contain chelating agents. Suitable chelating agents are described in commonly assigned U.S. Pat. No. 5,672,577, issued Sep. 30, 1997 to Lee, which is incorporated herein by reference. The addition of a chelator further improves the effectiveness of the formulation used as a etch residue or photoresist remover.

The composition may optionally contain surfactants. Suitable surfactants include poly(vinyl alcohol), poly(ethyleneimine) and any of the surfactant compositions classified as anionic, cationic, nonionic, amphoteric, and silicone based. Preferred surfactants are poly(vinyl alcohol) and poly(ethyleneimine).

Some combinations of components require the addition of acids and/or bases to adjust the pH to an acceptable value. The acids suitable for use in the present invention are organic or inorganic. The acids can include nitric, sulfuric, phosphoric, hydrochloric acids (though hydrochloric acid can be corrosive to metals) and the organic acids, formic, acetic, propionic, n-butyric, isobutyric, benzoic, ascorbic, gluconic, malic, malonic, oxalic, succinic, tartaric, citric, and gallic.

The caustic components suitable for use to adjust the pH of the cleaning solution can be composed of any common base, i.e. sodium, potassium, magnesium hydroxides, or the like. The major problem is that these bases introduce mobile ions into the final formulation. Mobile ions could destroy computer chips being produced today in the semiconductor industry. Other bases can be used that include ammonium hydroxide or derivatives thereof including trimethyl-2-hydroxyethyl ammonium hydroxide (choline), and the like.

The method of cleaning a substrate using the cleaning compositions of the present invention involves contacting a substrate having residue thereon, particularly organometallic or metal oxide residue, with a cleaning composition of the present invention for a time and at a temperature sufficient to remove the residue. Stirring, agitation, circulation, sonication or other techniques as are known in the art optionally may be used. The substrate is generally immersed in the cleaning composition. The time and temperature are determined based on the particular material being removed from a substrate. Generally, the temperature is in the range of from about ambient or room temperature to about 100° C., preferably 55° C., and the contact time is from about 1 to 60 minutes, preferably 5–30 minutes. Generally the substrate will be rinsed after using the composition. Preferred rinse solutions are isopropanol and DI water.

The compositions of the invention are particularly useful for removing residue from metal and via features but are also useful for stripping photoresists. The application of the present compositions as a photoresist stripper are easily determined by one of skill in the art. Similarly, the compositions of the present invention are also useful for metal or oxide etch. Such an application and the conditions therefor is also easily determined by one of skill in the art.

In addition to the benefits of using ammonium hydrogen fluoride, as described above, it has been found that the addition of a basic amine compound, such as 2-amino-2-ethoxy ethanol and the like, to a aqueous formulation containing a fluoride compound and an organic sulfoxide and/or sulfone solvent effectively neutralizes the HF by forming a quaternary ammonium fluoride salt, for example, according to the following reactions:

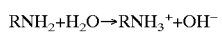

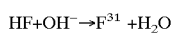

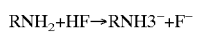

Since the F$^-$ ions do not attack silicon dioxide, the formulation is less aggressive and reduces unwanted etching.

It has also been found that by adding a co-solvent, such as ethyl lactate and the like, to a aqueous formulation containing a fluoride compound and an organic sulfoxide and/or sulfone solvent improves the capability of the formulation to remove etch residues and photoresists. The effect of ethyl lactate on removing etch residues is due to a modification of the hydrophobicity/hydrophilicity balance, wetting ability and/or the change of polarity of the blend. The addition of a co-solvent such as ethyl lactate and the like provides for active chemical attack by fluoride species, solvation and dissolution.

EXAMPLE 1

A group of cleaning chemistries containing the ingredients of ammonium fluoride, water, and a sulfoxide or sulfone solvent were tested with metal wafers which have stacks of TiN/AlCu/TiN/Ti/Oxide etched with a chlorinatedplasma in a commercially available etcher. The resulting metal wafers with residues were cut into small sample pieces, and then the sample pieces were immersed into the chemistry solutions in Table 1 for cleaning for 5 minutes at room temperature. The sample pieces were taken out, rinsed with deionized water and dried with the flow of $N_2$. SEM was performed with a Hitachi 4500 FE-SEM for evaluating cleaning and corrosion effects. Residue removal and corrosion effects on metal stack were assessed by visual comparisons and were all ranked on a scale of 1 to 10. The formulations in table 1 are shown in weight percent.

TABLE I

| Formula | 40% NH$_4$F | DI water | DMSO | ACN | HDA | Time (Min.) | Results Clean | Corrosion |
|---|---|---|---|---|---|---|---|---|
| A* | 0.75 | 20 | 75 | 0 | 0 | 5 | 10 | 10 |
| B | 1 | 35 | 0 | 64 | 0 | 5 | 10 | 8 |
| C | 1 | 35 | 0 | 0 | 64 | 5 | 8 | 10 |

Reaction Temperature: Room Temperature
DI water: Deionized water
DMSO: Dimethylsulfoxide
ACN: Acetonitrile
HDA: Hydroxylamine
Results
Clean lines: 1 - poor, 10 - complete
Corrosion: 1 - severe attack, 10 - no corrosion
*Formula A also contained 4.25% DMP The results showed that the DMSO containing formulation gave the combination of the best cleaning performance with the smallest extent of corrosion, in the form of a slight attack on aluminum. On this basis, DMSO was chosen for further study to provide an enhanced formulation.

EXAMPLE 3

A blend of 42.6 percent by weight ethyl lactate, 28.4 percent by weight DMSO, 28.4 percent by weight water and 0.4 percent by weight ammonium hydrogen fluoride was prepared to clean etch residue from a substrate. FIG. 1 shows the effective removal of the etch residue.

EXAMPLE 4

Figure 4A:
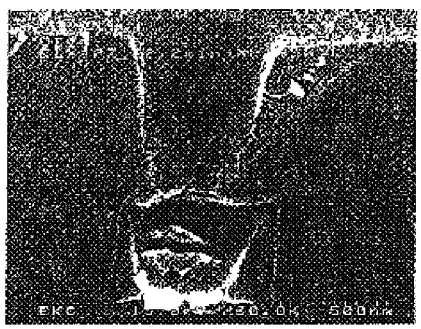
FIGS. 4A, 4B and 4C show the results of cleaning with hydrofluoric acid, ammonium hydrogen fluoride and ammonium fluoride respectively.
Figure 4B:
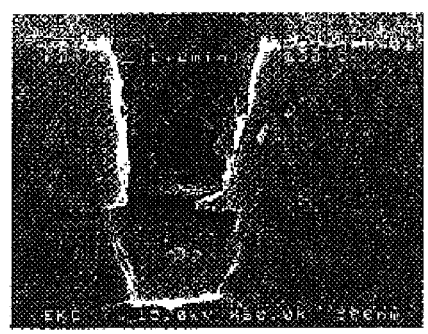
Figure 4C:
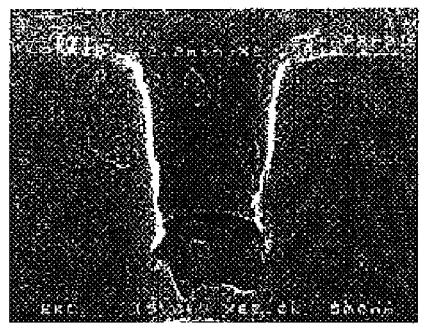

Ammonium hydrogen fluoride or ammonium bifluoride was substituted in place of ammonium fluoride and hydrofluoric acid. As can be seen in FIGS. 4A–4C, the best results were using ammonium hydrogen fluoride which effectively removed etch residue without over etching the via being cleaned.

EXAMPLE 5

Figure 6A:
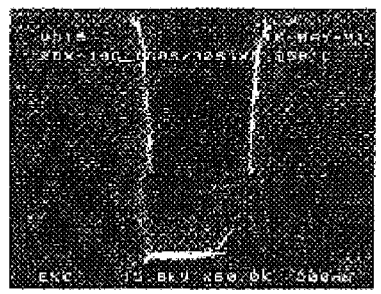
FIGS. 6A and 6B show results of cleaning vias using ester co-solvents.
Figure 6B:
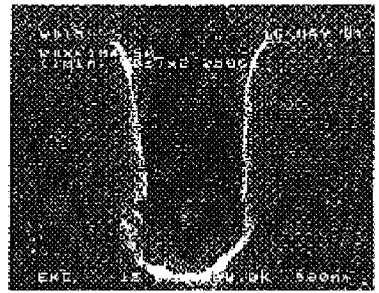

A investigation of the intrinsic cleaning performance by the different functional groups was undertaken. Propylene glycol was used as a hydroxyl source, acetyl acetone as carbonyl source, and DGA as nitrogen source. The SEM shown as FIGS. 5A–5C indicate that hydroxyl groups might help the removal of the bottom residues while carbonyl might aid the cleaning of the residue on the side-wall of the trench. Mixing these components, it was found that the two beneficial effects (alcohol and ketone) on the cleaning were conserved within the mixture. This new finding led to the investigation of the residue and photoresist removal ability of ester groups, which constitute the intermediary functional group in term of polarizability between carboxylic acid/glycol and ketone. The first ester compound tested was methyl acetate and gave beneficial results. The benefits of using an ester group were further confirmed by testing ethylene glycol diacetate and ethyl lactate as is shown in FIGS. 6A and 6B. Due to its higher solubility in an aqueous solution, ethyl lactate is the preferred ester and the preferred co-solvent.

Figure 7:
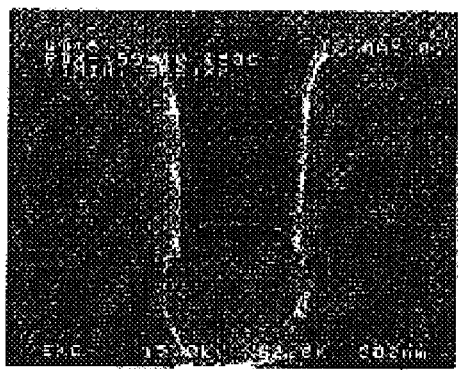
FIG. 7 shows the results with a 1:1.5:1 ratio of dimethylsulfoxide/ethyl laurate/water.

Different solutions were made up with different DMSO/ESTERI/DIW ratios and it was found that the preferred ratio is about 1/1.5/1, in the case of ethyl lactate, as can be seen by the results of SEM FIG. 7.

Based on the results of Example 1, formulations with a variety of concentrations of DMSO were tested to determine the effective ranges in combination with ammonium fluoride in the presence of water. The results showed that for cleaning etch resist, DMSO is effective at a concentrations from about 10 percent by weight to about 95% by weight and the effectiveness of the formulation was enhanced by the addition of a basic organic amine or a co-solvent. The following table demonstrates formulations found to be more effective and versatile than formulations with DMSO alone.

TABLE 2

| Formula | DMSO | Co-Solvent | Water | Fluoride | Basic Organic Amine | Chelating Agents | Potential field of application |
|---|---|---|---|---|---|---|---|
| 1 | 65.5 | | 30.6 | AF = 1.4 | DGA = 2.5 | | Stable etchant; residue remover, photoresist remover |
| 2 | 69 | | 29.5 | AHF = 1.5 | | | Stable etchant; residue remover, photoresist remover |
| 3 | 69 | | 27.4 | AHF = 1.5 | Choline (45% in water) = 2.1 | | Stable etchant; residue remover, photoresist remover |
| 4 | 69 | | 26 | AHF = 1.5 | Choline (45% in water) = 3.5 | | Stable etchant; residue remover, photoresist remover |
| 5 | 69 | | 24.6 | AHF = 1.5 | Choline (45% in water) = 4.9 | | Stable etchant; residue remover, photoresist remover |
| 6 | 69 | | 21.8 | AHF = 1.5 | Choline (45% in water) = 7.7 | | Stable etchant; residue remover, photoresist remover |
| 7 | 69 | | 23.1 | 20% aq AHF = 7.4 | MEA = 0.5 | | Stable etchant; residue remover, photoresist remover |
| 8 | 69 | | 22.8 | 20% aq AHF = 7.4 | MEA = 0.8 | | Stable etchant; residue remover, photoresist remover |
| 9 | 69 | | 22.5 | 20% aq AHF = 7.4 | MEA = 1.1 | | Stable etchant; residue remover, photoresist remover |
| 10 | 69 | | 22 | 20% aq AHF = 7.4 | MEA = 1.60 | | Stable etchant; residue remover, photoresist remover |
| 11 | 69 | | 30 | HF = 0 5 | MEA = 0.5 | | Stable etchant; residue remover, photoresist remover |
| 12 | 69 | | 29.7 | HF = 0.5 | MEA = 0.8 | | Stable etchant; residue remover, photoresist remover |
| 13 | 69 | | 29.4 | HF = 0.5 | MEA = 1.1 | | Stable etchant; residue remover, photoresist remover |
| 14 | 69 | | 28.7 | HF = 0.5 | MEA = 1.8 | | Stable etchant; residue remover, photoresist remover |
| 15 | 69 | | 29.7 | HF = 0.5 | DGA = 0.84 | | Stable etchant; residue remover, photoresist remover |
| 16 | 69 | | 29.1 | HF = 0.5 | DGA = 1.36 | | Stable etchant; residue remover, photoresist remover |
| 17 | 69 | | 28.3 | HF = 0.5 | DGA = 2.20 | | Stable etchant; residue remover, photoresist remover |
| 18 | 69 | | 27.4 | HF = 0.5 | DGA = 3.15 | | Stable etchant; residue remover, photoresist remover |
| 19 | 69 | | 29.3 | AF = 0.6; AHF = 1.1 | | | Stable etchant; residue remover, photoresist remover |
| 20 | 69 | | 29.1 | AF = 1.2; AHF = 0.75 | | | Stable etchant; residue remover, photoresist remover |
| 21 | 69 | | 28.8 | AF = 1.8; AHF = 0.37 | | | Stable etchant; residue remover, photoresist remover |
| 22 | 69 | | 25.1 | AHF (20% in water) = 5.9 | Choline (45% in water) = 0 | | Stable etchant; residue remover, photoresist remover |
| 23 | 69 | | 23 | AHF (20% in water) = 5.9 | Choline (45% in water) = 2.1 | | Stable etchant; residue remover, photoresist remover |
| 24 | 69 | | 21.6 | AHF (20% in water) = 5.9 | Choline (45% in water) = 3.5 | | Stable etchant; residue remover, photoresist remover |
| 25 | 69 | | 20.2 | AHF (20% in water) = 5.9 | Choline (45% in water) = 4.9 | | Stable etchant; residue remover, photoresist remover |
| 26 | 69 | | 17.4 | AHF (20% in water) = 5.9 | Choline (45% in water) = 7.7 | | Stable etchant; residue remover, photoresist remover |
| 27 | 69 | | 25.5 | AHF (20% in water) = 5.5 | | | Stable etchant; residue remover, photoresist remover |
| 28 | 69 | | 27.3 | AHF (20% in water) = 3.7 | | | Stable etchant; residue remover, photoresist remover |

TABLE 2-continued

| Formula | DMSO | Co-Solvent | Water | Fluoride | Basic Organic Amine | Chelating Agents | Potential field of application |
|---|---|---|---|---|---|---|---|
| 29 | 69 | | 27.7 | AHF (20% in water) = 2.3 | | | Stable etchant; residue remover, photoresist remover |
| 30 | 10 | | 82.6 | AHF (20% in water) = 7.4 | | | Stable etchant; residue remover |
| 31 | 30 | | 62.6 | AHF (20% in water) = 7.4 | | | Stable etchant; residue remover |
| 32 | 50 | | 42.6 | AHF (20% in water) = 7.4 | | | Stable etchant; residue remover, photoresist remover |
| 33 | 70 | | 22.6 | AHF (20% in water) = 7.4 | | | Stable etchant; residue remover, photoresist remover |
| 34 | 90 | | 2.6 | AHF (20% in water) = 7.4 | | | Stable etchant; residue remover, photoresist remover |
| 35 | 69 | | 28.5 | HF(40% aq) = 0.65 | Choline = 1.9 | | Stable etchant; residue remover, photoresist remover |
| 36 | 69 | | 27.7 | HF(40% aq) = 0.65 | Choline = 2.7 | | Stable etchant; residue remover, photoresist remover |
| 37 | 69 | | 26.9 | HF(40% aq) = 0.65 | Choline = 3.5 | | Stable etchant; residue remover, photoresist remover |
| 38 | 69 | | 29.6 | HF(40% aq) = 0.65 | DGA = 0.74 | | Stable etchant; residue remover, photoresist remover |
| 39 | 69 | | 29.4 | HF(40% aq) = 0.65 | DGA = 1.0 | | Stable etchant; residue remover, photoresist remover |
| 40 | 69 | | 29 | HF(40% aq) = 0.65 | DGA = 1.4 | | Stable etchant; residue remover, photoresist remover |
| 41 | 69 | | 25.3 | AHF(20% aq) = 5.7 | | | Stable etchant; residue remover, photoresist remover |
| 42 | 69 | | 28.2 | AHF(20% aq) = 2.85 | | | Stable etchant; residue remover, photoresist remover |
| 43 | 69 | | 30.4 | AHF(20% aq) = 0.57 | | | Stable etchant; residue remover, photoresist remover |
| 44 | 85 | | 12.2 | AHF(20% aq) = 2.85 | | | Stable etchant; residue remover, photoresist remover |
| 45 | 50 | | | AHF = 3.705 | DGA = 50 | | Stable etchant; residue remover, photoresist remover |
| 46 | 50 | | | AHF = 1.8525 | DGA = 50 | | Stable etchant; residue remover, photoresist remover |
| 47 | 69 | | 29.5 | AHF(20% aq) = 1.4 | MEA = 0.15 | | Stable etchant; residue remover, photoresist remover |
| 48 | 69 | | 27.9 | AHF(20% aq) = 2.80 | MEA = 0.30 | | Stable etchant; residue remover, photoresist remover |
| 49 | 69 | | 29.4 | AHF(20% aq) = 1.4 | MEA = 0.21 | | Stable etchant; residue remover, photoresist remover |
| 50 | 69 | | 27.8 | AHF(20% aq) = 2.80 | MEA = 0.42 | | Stable etchant; residue remover, photoresist remover |
| 51 | 69 | | 29.3 | AHF(20% aq) = 1.4 | MEA = 0.30 | | Stable etchant; residue remover, photoresist remover |
| 52 | 69 | | 27.6 | AHF(20% aq) = 2.80 | MEA = 0.60 | | Stable etchant; residue remover, photoresist remover |
| 53 | 67.3 | | 28.7 | AF = 1.3 | DGA = 0.1 | Gallic Acid = 1.6 | Stable etchant; residue remover, photoresist remover |
| 54 | 68.3 | Acetic Acid = 0.9 | 29.5 | AF = 1.3 | | | Stable etchant; residue remover, photoresist remover |
| 55 | 68 | Acetic Acid = 0.6 | 29.2 | AF = 2.2 | | | Stable etchant; residue remover, photoresist remover |
| 56 | 67.9 | Acetic Acid = .6 | 29.1 | AF = 2.2 | DGA = 0.1 | | Stable etchant; residue remover, photoresist remover |
| 57 | 49.1 | NMP = 19.6 | 29.6 | AHF = 1.3 | MEA = 0.3 | | Stable etchant; residue remover |
| 58 | 19.6 | NMP = 49.1 | 29.5 | AHF = 1.3 | MEA = 0.3 | | Stable etchant; residue remover |
| 59 | 58.3 | Ethyl Acetate = 16.6 | 25 | AHF = 0.4 | | | Stable etchant; residue remover, photoresist remover |
| 60 | 53.8 | Ethyl Acetate = 15.3; PG = 7.7 | 23 | AHF = 0.4 | | | Stable etchant; residue remover, photoresist remover |
| 61 | 49.7 | Ethyl Acetate = 28.4 | 21 | AHF = 0.4 | | | Stable etchant; residue remover |
| 62 | 46.6 | Ethyl Acetate = 26.6 PG = 6.6 | 20 | AHF = 0.4 | | | Stable etchant; residue remover |
| 63 | 44.9 | Ethyl Acetate = 25.8%; PG = 6.4; Acetyl Acetone = 3 | 19.3 | AHF = 0.4 | | | Stable etchant; residue remover |
| 64 | 45.5 | Ethyl Acetate = 26 PG = 8.6 | 19.5 | AHF = 0.4 | | | Stable etchant; residue remover |

TABLE 2-continued

| Formula | DMSO | Co-Solvent | Water | Fluoride | Basic Organic Amine | Chelating Agents | Potential field of application |
|---|---|---|---|---|---|---|---|
| 65 | 28.4 | Methyl-s-lactate = 42.6 | 28.4 | AHF = 0.4 | | | Stable etchant; residue remover |
| 66 | 28.4 | Ethyl-s-lactate = 42.6 | 28.4 | AHF = 0.4 | | | Stable etchant; residue remover |
| 67 | 24.9 | Ethylene glycol diacetate = 37.3 | 37.3 | AHF = 0.4 | | | Stable etchant; residue remover |
| 68 | 24.9 | Poly ethylene glycol monolaurate = 37.3 | 37.3 | AHF = 0.4 | | | Stable etchant; residue remover |
| 69 | 33.1 | Ethylene glycol diacetate = 49.7 | 16.5 | AHF = 0.4 | | | Stable etchant; residue remover |
| 70 | 28.4 | Ethylene glycol diacetate = 42.6 | 28.4 | AHF = 0.4 | | | Stable etchant; residue remover |
| 71 | 24.9 | Ethylene glycol diacetate = 37.30 | 37.3 | AHF = 0.4 | | | Stable etchant; residue remover |
| 72 | 16.5 | Ethylene glycol diacetate = 56.8 | 16.5 | AHF = 0.4 | | | Stable etchant; residue remover |
| 73 | 14.2 | Ethylene glycol diacetate = 52 | 28.4 | AHF = 0.4 | | | Stable etchant; residue remover |
| 74 | 12.5 | Ethylene glycol diacetate = 49.7 | 37.4 | AHF = 0.4 | | | Stable etchant; residue remover |
| 75 | 33.1 | Ethyl-s-lactate = 49.7 | 16.5 | AHF = 0.4 | | | Stable etchant; residue remover |
| 76 | 28.4 | Ethyl-s-lactate = 42.6 | 28.4 | AHF = 0.4 | | | Stable etchant; residue remover |
| 77 | 24.9 | Ethyl-s-lactate = 37.3 | 37.3 | AHF = 0.4 | | | Stable etchant; residue remover |
| 78 | 16.5 | Ethyl-s-lactate = 56.8 | 16.5 | AHF = 0.4 | | | Stable etchant; residue remover |
| 79 | 14.2 | Ethyl-s-lactate = 52 | 28.4 | AHF = 0.4 | | | Stable etchant; residue remover |
| 80 | 12.5 | Ethyl-s-lactate = 49.7 | 37.4 | AHF = 0.4 | | | Stable etchant; residue remover |
| 81 | 18 | NMP = 49 | 29.3 | AF(40%) = 0.75 | DGA = 3 | | Residue remover |
| 82 | 25 | NMP = 20; PC = 25 | 29.3 | AF(40%) = 0.75 | | | Residue remover |
| 83 | 25 | PC = 45 | 29.3 | AF(40%) = 0.75 | | | Residue remover |
| 84 | 25 | NMP = 45 | 29.3 | AF(40%) = 0.75 | | | Residue remover |
| 85 | 40 | NMP = 30 | 29.3 | AF(40%) = 0.75 | | | Residue remover |
| 86 | 57.25 | | 29.3 | AF(40%) = 3.5 | DGA = 10 | | Residue remover |
| 87 | 62.25 | | 29.3 | AF(40%) = 3.5 | DGA = 5 | | Residue remover |
| 88 | 64.25 | | 29.3 | AF(40%) = 3.5 | DGA = 3 | | Residue remover |
| 89 | 64.75 | | 29.3 | AF(40%) = 3.5 | DGA = 2.5 | | Residue remover |
| 90 | 30 | NMP = 36.5; PG = 2.9 | 30 | HF(50%) = 0.1 | MIPA = 0.5 | | Residue remover |
| 91 | 30 | NMP = 34.5; PG = 2.9 | 30 | HF(50%) = 0.1 | DGA = 2.5 | | Residue remover |
| 92 | 30 | NMP = 36.9; PG = 2.9 | 30 | HF(50%) = 0.1 | MEA = 0.1 | | Residue remover |
| 93 | 30 | NMP = 55.5; PG = 2.9 | 10 | HF(50%) = 0.1 | MEA = 1 | DCH = 0.5 | Residue remover |
| 94 | 32 | NMP = 52.5; PG = 2.9 | 10 | HF(50%) = 0.1 | MEA = 2 | DCH = 0.5 | Residue remover |
| 95 | 33.5 | NMP = 30; PG = 2.9 | 30 | HF(50%) = 0.1 | DGA = 3.5 | | Residue remover |
| 96 | 34.5 | NMP = 55.5; PG = 2.9 | 5 | HF(50%) = 0.1 | DGA = 2 | | Residue remover |
| 97 | 35 | NMP = 30; PG = 2.9 | 30 | HF(50%) = 0.1 | DGA = 2 | | Residue remover |

TABLE 2-continued

| Formula | DMSO | Co-Solvent | Water | Fluoride | Basic Organic Amine | Chelating Agents | Potential field of application |
|---|---|---|---|---|---|---|---|
| 98 | 35 | NMP = 50; PG = 2.9 | 10 | HF(50%) = 0.1 | DGA = 2 | | Residue remover |
| 99 | 35 | NMP = 56.9; PG = 2.9 | 5 | HF(50%) = 0.1 | MEA = 0.1 | | Residue remover |
| 100 | 35.5 | NMP = 30; PG = 2.9 | 30 | HF(50%) = 0.1 | MIPA = 1.5 | | Residue remover |
| 101 | 36 | NMP = 30; PG = 2.9 | 30 | HP(50%) = 0.1 | MIPA = 1 | | Residue remover |
| 102 | 36 | NMP = 30; PG = 2.9 | 30 | HF(50%) = 0.1 | MEA = 1 | | Residue remover |
| 103 | 36.5 | NMP = 30; PG = 2.9 | 30 | HF(50%) = 0.1 | MEA = 0.5 | | Residue remover |
| 104 | 36.9 | NMP = 30; PG = 2.9 | 30 | HF(50%) = 0.1 | MIPA = 0.1 | | Residue remover |
| 105 | 36.9 | NMP = 30; PG = 2.9 | 30 | HF(50%) = 0.1 | MEA = 0.1 | | Residue remover |
| 106 | 37 | NMP = 49.9; PG = 2.9 | 10 | HF(50%) = 0.1 | MEA = 0.1 | | Residue remover |
| 107 | 37 | NMP = 49.5; PG = 2.9 | 10 | HF(50%) = 0.1 | MEA = 0.5 | | Residue remover |
| 108 | 37 | NMP = 54.5; PG = 2.9 | 5 | HF(50%) = 0.1 | MEA = 0.5 | | Residue remover |
| 109 | 37 | NMP = 49; PG = 2.9 | 10 | HF(50%) = 0.1 | MEA = 0.5 | DCH = 0.5 | Residue remover |
| 110 | 37 | NMP = 48; PG = 2.9 | 10 | HF(50%) = 0.1 | MEA = 1.5 | DCH = 0.5 | Residue remover |
| 111 | 53.75 | PG = 15 | 27.3 | AF(40%) = 2.5 | HDA ® = 1.5 | | Residue remover |
| 112 | 68 | | 28.5 | AF(40%) = 2.5 | DEHA = 1 | | Residue remover |
| 113 | 68.5 | | 28.5 | AF(40%) = 2.5 | DEHA = 0.5 | | Residue remover |
| 114 | 68.9 | | 28.5 | AF(40%) = 2.5 | DEHA = 0.1 | | Residue remover |
| 115 | 71.8 | | 28 | HF(50%) = 0.1 | TBPH = 0.1 | | Residue remover | where: HF = hydrogen fluoride
DCH = dicarbethoxy hydrazine
AHF = ammonium hydrogen fluoride (ammonium bifluoride)
AF = ammonium fluoride
MEA = monoethanolamine
PG = propylene glycol
HDA ® = hydroxylamine
MIPA = monoisopropanolamine
TBPH = tetrabutyl phosphonium hydroxide
TMAF = tetramethylammonium formate
DGA = diglycolamine
NMP = N-methyl pyrrolidone
PC = propylene carbonate
DEHA = diethylhydroxylamine A preferred embodiment comprises: 65.5% DMSO, 3.5% ammonium fluoride (40% aqueous), 28.5% DI water, and 2.5% DGA. (Performance: Clean=10, Corrosion=10).

Another preferred embodiment comprises: 25% DMSO, 0.75% ammonium fluoride (40% aqueous), 29.25% DI water, and 45% NMP. (Performance: Clean=10, Corrosion=10).

Another preferred embodiment comprises: 40% DMSO, 0.75% ammonium fluoride (40% aqueous), 29.25% DI water, and 30% NMP. (Performance: Clean=10, Corrosion=10).

Another preferred embodiment comprises: 18% DMSO, 0.75% ammonium fluoride (40% aqueous), 29.25% DI water, 49.5% NMP, and 3% DGA (Performance: Clean=9.8, Corrosion=10).

Similarly, with routine experimentation, one skilled in the art can easily determine effective amounts of each component of the present invention for the particular photoresist stripping, post-etch residue cleaning, or metal or oxide etch application.

One skilled in the art will recognize from the foregoing examples that modifications and variations can, and are expected to be made, to the foregoing solution in accordance with varying conditions inherent in the production process. The embodiments above are given by way of example. The teaching examples do not limit the present invention.

All publications and patent applications mentioned in this specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. A method of removing a photoresist coating from a substrate using a composition comprising from about 0.01 percent by weight to about 10 percent by weight of one or more fluoride compounds, from about 15 percent by weight to about 50 percent by weight water, from about 10 percent by weight to about 95 percent by weight of a compound which is either an organic sulfoxide corresponding to the following:

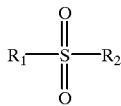

where $R_1$ and $R_2$ are H, OH or an alkyl, at least one of $R_1$ and $R_2$ is an alkyl, or a sulfone solvent corresponding to the following:

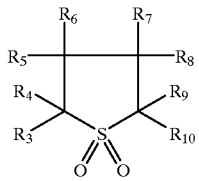

where $R_1$–$R_{10}$ are independently H or an alkyl group from about 0.1 to about 15 percent by weight of a basic amine compound, and a co-solvent selected from the group consisting of acethic acid, methyl acetate, methyl lactate, ethyl acetate, ethylene glycol diacetate, ethyl lactate, propylene glycol, propylene carbonate, N-methyl pyrrolidone, methoxyethoxyethanol and polyethylene glycol monolaurate.

2. A method of removing etch residue from a substrate using a composition comprising from about 0.01 percent by weight to about 10 percent by weight of one or more fluoride compounds, from about 15 percent by weight to about 50 percent by weight water, from about 10 percent by weight to about 95 percent by weight of a compound which is either an organic sulfoxide corresponding to the following:

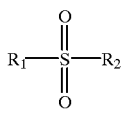

where $R_1$ and $R_2$ are H, OH or an alkyl, at least one of $R_1$ and $R_2$ is an alkyl, or a sulfone solvent corresponding to the following:

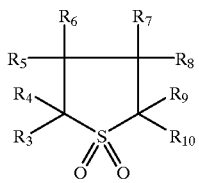

where $R_3$–$R_{10}$ are independently H or an alkyl group, from about 0.1 to about 15 percent by weight of a basic amine compound, and a co-solvent selected from the group consisting of acetic acid, methyl acetate, methyl lactate, ethyl acetate, ethylene glycol diacetate, ethyl lactate, propylene glycol, propylene, carbonate, N-methyl pyrrolidone, methoxyethoxyethanol and polyethylene glycol monolaurate.

3. A method of etching silicon oxide using a composition comprising from about 20 percent by weight to about 40 percent by weight of one or more fluoride compounds, from about 15 percent by weight to about 50 percent by weight water, from about 10 percent by weight to about 95 percent by weight of a compound which is either an organic sulfoxide corresponding to the following:

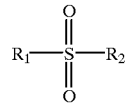

where $R_1$ and $R_2$ are H, OH or an alkyl, at least one of $R_1$ and $R_2$ is an alkyl or a sulfone solvent corresponding to the following:

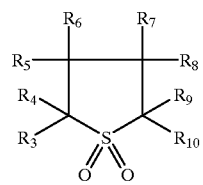

where $R_1$–$R_{10}$ are independently H or an alkyl group, and and from about 0.1 to about 15 percent by weight of a basic amine compound.

4. A method of removing a photoresist coating from a substrate using a composition comprising from about 0.01 percent by weight to about 10 percent by weight of ammonium hydrogen fluoride, from about 15 percent by weight to about 50 percent by weight and water, from about 10 percent by weight to about 95 percent by weight and water, from about 10 percent by corresponding to the following:

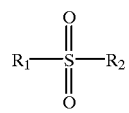

where $R_1$ and $R_2$ are H, OH or an alkyl, at least one of $R_1$ and $R_2$ is an alkyl, or a sulfone solvent corresponding to the following:

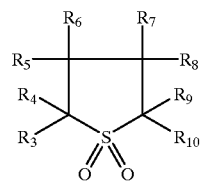

where $R_1$–$R_{10}$ are independently Hor an alkyl group.

5. A method of removing etch residue from a substrate using a composition comprising from about 0.01 percent by weight to about 10 percent by weight of ammonium hydrogen fluoride, from about 15 percent by weight to about 50 percent by weight water, from about 10 percent by weight to about 95 percent by weight of a compound which is either an organic sulfoxide corresponding to the following:

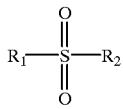

where $R_1$ and $R_2$ are H, OH or an alkyl, at least one of $R_1$ and $R_2$ is an alkyl, or a sulfone solvent corresponding to the following:

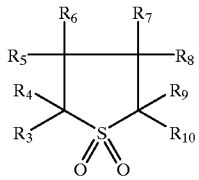

where $R_1$–$R_{10}$ are independently H or an alkyl group.

6. A method of etching silicon oxide using a composition comprising from about 20 percent by weight to about 40 percent by weight of one or more fluoride compounds selected from the group consisting of ammonium hydrogen fluoride and ammonium bifluoride, from about 15 percent by weight to about 50 percent by weight water, and from about 10 percent by weight to about 95 percent by weight of a compound which is either an organic sulfoxide corresponding to the

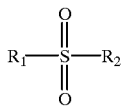

where $R_1$ and $R_2$ are H, OH or an alkyl, at least one of $R_1$ and $R_2$ is an alkyl, or sulfone solvent corresponding to the following:

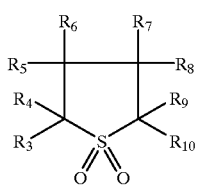

where $R_3$–$R_{10}$ are indenpenting H or an alkyl group, and a co-solvent.

7. A method of etching silicon oxide using a composition comprising from about 20 percent by weight to about 40 percent by weight of one or more fluoride compounds, from about 15 percent by weight to about 50 percent by weight water and from about 10 percent by weight to about 95 percent by weight of a compound which is either an organic sulfoxide solvent corresponding to the following:

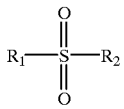

where $R_1$ and $R_2$ are H, OH or an alkyl, at least one of $R_1$ and $R_2$ is an alkyl or sulfone solvent corresponding to the following:

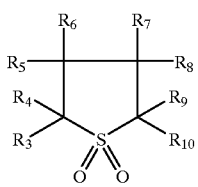

where $R_1$–$R_{10}$ are independently H or an alkyl group.

8. The method of claim 2 wherein the co-solvent is present in an amount from about 0.1 to about 60 percent by weight.

9. The composition of claim 2 wherein said fluoride compound is ammonium hydrogen fluoride and said organic sulfoxide is dimethylsulfoxide.

10. The method of claim 2 wherein said fluoride compound is ammonium bifluoride and said organic sulfoxide is dimethylsulfoxide.

11. The method of claim 2 further comprising a chelating agent selected from the group consisting of gallic acid, catechol, tetrabutyl phosphonium hydroxide and dicarbethoxyhydrazine.

12. The method of claim 5 wherein the composition further contains a co-solvent selected from the group consisting of acetic acid, methyl acetate, methyl lactate, ethyl acetate, ethylene glycol diacetate, ethyl lactate, propylene glycol, propylene carbonate, N-methyl pyrrolidone, methoxyethoxyethanol and polyethylene glycol monolaurate.

13. The method of claim 5 wherein the composition further contains a basic amine compound selected from the group consisting of hydroxylamine, hydrazine, 2-amino-2-ethoxy ethanol, monoethanolamine, diethylhydroxylamine, choline, tetramethylammonium formate, monoisopropanolamine, diethanolamine, and triethanolamine.

14. The composition of claim 5 further comprising a chelating agent selected from the group consisting of gallic acid, catechol, tetrabutyl phosphonium hydroxide and dicarbethoxyhydrazine.

15. The method of claim 5 wherein said co-solvent is ethyl lactate and is present in an amount from about 30 percent by weight to about 60 percent by weight.

16. The method of claim 7 wherein said fluoride compound is ammonium bifluoride.

17. The method of claim 7 wherein said fluoride compound is ammonium hydrogen fluoride.

* * * * *

UNITED STATES PATENT AND TRADEMARK OFFICE
CERTIFICATE OF CORRECTION

PATENT NO. : 6,777,380 B2
DATED : August 17, 2004
INVENTOR(S) : Small et al.

It is certified that error appears in the above-identified patent and that said Letters Patent is hereby corrected as shown below:

Column 19,
Line 24, delete "$R_1$" and insert -- $R_3$ -- and between the words "group" and "from" insert -- , --.
Line 26, delete "acethic" and insert -- acetic --.
Line 63, between the words "propylene" and "carbonate" delete ",".

Column 20,
Line 16, delete "follawing" and insert -- following --.
Line 27, delete "$R_1$" and insert -- $R_3$ --.
Lines 35 and 36, delete "and water, from about 10 percent by" and insert -- of a compound which is either an organic sulfoxide --.
Line 58, delete "$R_1$" and insert -- $R_3$ -- and delete "Hor" and insert -- H or --.

Column 21,
Line 20, delete "$R_1$" and insert -- $R_3$ --.
Line 29, after the words "to the" insert -- following: --.

Column 22,
Line 20, delete "$R_1$" and insert -- $R_3$ --.

Signed and Sealed this

First Day of February, 2005

JON W. DUDAS
*Director of the United States Patent and Trademark Office*